United States Patent
Choi

(10) Patent No.: US 7,347,900 B2
(45) Date of Patent: Mar. 25, 2008

(54) CHEMICAL VAPOR DEPOSITION APPARATUS AND METHOD

(75) Inventor: Seung-Chul Choi, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 125 days.

(21) Appl. No.: 10/735,912

(22) Filed: Dec. 16, 2003

(65) Prior Publication Data

US 2004/0123806 A1 Jul. 1, 2004

(30) Foreign Application Priority Data

Dec. 17, 2002 (KR) .................. 10-2002-0080762

(51) Int. Cl.
- C23C 16/52 (2006.01)
- C23C 16/455 (2006.01)
- C23C 16/458 (2006.01)
- C23C 16/00 (2006.01)
- G06F 19/00 (2006.01)
- H01L 21/3065 (2006.01)

(52) U.S. Cl. .................. 118/696; 118/715; 118/729; 118/684; 118/697; 156/345.26; 156/345.34; 156/345.54; 700/121

(58) Field of Classification Search ............... 118/715, 118/729, 684, 696, 697; 156/345.33, 345.34, 156/345.54, 345.26, 345.29; 700/121
See application file for complete search history.

(56) References Cited

U.S. PATENT DOCUMENTS

| 5,620,523 A | * | 4/1997 | Maeda et al. .......... 118/723 IR |
| 5,628,869 A | | 5/1997 | Mallon |
| 5,903,711 A | * | 5/1999 | Okase ........................ 392/418 |
| 5,962,085 A | * | 10/1999 | Hayashi et al. ............. 427/585 |
| 6,022,811 A | | 2/2000 | Yuuki et al. |
| 6,132,562 A | * | 10/2000 | Baumecker et al. ... 204/192.12 |
| 6,149,365 A | * | 11/2000 | White et al. ................. 414/217 |
| 6,151,446 A | * | 11/2000 | Hunter et al. ............... 392/416 |
| 6,221,770 B1 | | 4/2001 | Hillman et al. |
| 6,223,683 B1 | * | 5/2001 | Plester et al. ......... 118/723 VE |
| 6,289,842 B1 | | 9/2001 | Tompa |
| 6,294,026 B1 | * | 9/2001 | Roithner et al. ............ 118/715 |
| 6,333,269 B2 | | 12/2001 | Naito et al. |

(Continued)

FOREIGN PATENT DOCUMENTS

JP 60-189928 * 9/1985

(Continued)

Primary Examiner—Jeffrie R Lund
(74) Attorney, Agent, or Firm—Pillsbury Winthrop Shaw Pittman LLP

(57) ABSTRACT

A chemical vapor deposition (CVD) apparatus includes a process chamber where a deposition process is performed on a wafer. A gas supply assembly is mounted in the process chamber for supplying a process gas to the process chamber, and a vacuum pump is mounted in the process chamber for exhausting the process gas. A support is mounted in the process chamber for supporting the wafer, and a position control assembly raises and lowers the chuck. A controller controls the position control assembly to vary a distance between the wafer and the gas supply assembly during the deposition process. A CVD method for forming a deposition layer on a wafer includes supplying a process gas to a process chamber, dividing a process time into a plurality of process stages, varying a distance between the wafer and a gas supply assembly according to the process stages, and exhausting the process gas.

4 Claims, 3 Drawing Sheets

U.S. PATENT DOCUMENTS

| | | |
|---|---|---|
| 6,354,832 B1 * | 3/2002 | Yoshimura et al. ......... 432/247 |
| 6,392,350 B1 | 5/2002 | Amano |
| 6,641,674 B2 * | 11/2003 | Peng ........................ 118/727 |
| 6,709,523 B1 * | 3/2004 | Toshima et al. ............. 118/725 |
| 6,793,733 B2 * | 9/2004 | Janakiraman et al. ....... 118/715 |
| 6,905,940 B2 * | 6/2005 | Ingle et al. .................. 438/424 |
| 7,175,713 B2 * | 2/2007 | Thakur et al. .............. 118/715 |
| 2001/0047759 A1 * | 12/2001 | Matsui et al. ........... 118/723 E |
| 2002/0132374 A1 * | 9/2002 | Basceri et al. ................. 438/3 |
| 2003/0000473 A1 * | 1/2003 | Chae et al. ................. 118/715 |
| 2003/0037802 A1 * | 2/2003 | Nakahara et al. ............ 134/1.1 |
| 2003/0203626 A1 * | 10/2003 | Derderian et al. .......... 438/689 |
| 2004/0103844 A1 * | 6/2004 | Chou et al. ................. 118/715 |
| 2004/0112539 A1 * | 6/2004 | Larson et al. .......... 156/345.33 |
| 2004/0112540 A1 * | 6/2004 | Larson et al. .......... 156/345.33 |
| 2004/0123806 A1 * | 7/2004 | Choi ......................... 118/729 |
| 2005/0106319 A1 * | 5/2005 | Jurgensen et al. ........ 427/248.1 |
| 2005/0142895 A1 * | 6/2005 | Ingle et al. ................. 438/787 |

FOREIGN PATENT DOCUMENTS

| | | | |
|---|---|---|---|
| JP | 61-005515 | * | 1/1986 |
| JP | 03-281780 | * | 12/1991 |

* cited by examiner

CHEMICAL VAPOR DEPOSITION APPARATUS AND METHOD

CROSS REFERENCE TO RELATED APPLICATIONS

This application claims priority to Korean patent application No. 10-2002-0080762 filed Dec. 17, 2002, the entire contents of which is incorporated by reference in its entirety.

BACKGROUND OF THE INVENTION

1. Field of the Invention

The present invention relates to a chemical vapor deposition apparatus and a method thereof, and more particularly, to a chemical vapor deposition apparatus and a method thereof that uniformly form a deposition layer on a wafer.

2. Description of the Related Art

Chemical vapor deposition (CVD) is a process used to form a deposition layer on a wafer. In CVD, the deposition layer is formed by the reaction of gas phase reactants at or near the wafer surface. A CVD process is generally performed by securing a wafer in a chamber in a vacuum state, and by creating a low pressure, high pressure, or plasma environment in the chamber. Then, a process gas is injected into the chamber so that the particles of the process gas are deposited on the wafer. In this deposition method, the process gas is injected into and exhausted from the chamber, thereby creating a flow of process gas in which the substrate is placed.

A CVD apparatus for performing CVD typically includes a shower head or a nozzle for injecting process gas into the chamber, and a pumping assembly for exhausting the process gas from the chamber.

Related to the CVD process, U.S. Pat. No. 6,392,350 discloses a plasma processing method capable of reducing a preheating time. Also, U.S. Pat. No. 6,022,811 discloses a CVD process for evenly forming a depositing layer.

Related to the CVD apparatus, U.S. Pat. Nos. 6,221,770, 5,628,869, and 6,333,269 disclose PECVD (plasma-enhanced CVD) apparatuses that use plasma; and U.S. Pat. No. 6,289,842 discloses an MOCVD (metal organic CVD) apparatus that forms a deposition layer in a low pressure, and a high or low temperature environment.

In the processes and apparatuses of the above patents, the spacing between the shower heads or nozzles and the wafer remains fixed. Therefore, the process gas supplied to the center of the wafer flows along the surface thereof until reaching the edges of the wafer, after which the process gas is exhausted by a vacuum pump. A drawback of this approach is that the deposition layer at the edges of the wafer is thicker than at the center of the wafer.

SUMMARY OF THE INVENTION

In an exemplary embodiment of the present invention, there is provided a chemical vapor deposition apparatus and a method thereof that uniformly form a deposition layer at both the center and the edge portions of a wafer.

In an exemplary embodiment of the present invention, there is provided a chemical vapor deposition apparatus that includes a process chamber, inside of which a wafer is secured to perform a deposition process thereon. The apparatus further includes a gas supply assembly mounted in the process chamber and configured to supply a process gas inside the process chamber. The apparatus also comprises a vacuum pump mounted in the process chamber and configured to exhaust the process gas from the process chamber. In this CVD apparatus, a chuck is mounted in the process chamber and is configured to support the wafer. In addition, this apparatus comprises a position control assembly configured to raise and lower the chuck and a controller constructed and arranged to control the position control assembly such that a distance between the wafer and the gas supply assembly is varied during the deposition process.

In an embodiment of the invention, the gas supply assembly is divided into a first section that occupies a center portion of the gas supply assembly, and a second section that occupies an outer portion of the gas supply assembly. A process gas line is connected to each of the first section and the second section, and a control valve, opened and closed by the controller, is mounted on the process gas lines of the second section.

In an exemplary embodiment of the present invention, a chemical vapor deposition method for forming a deposition layer on a wafer, includes supplying a process gas to a process chamber, dividing a process time required for forming the deposition layer into a plurality of process stages, varying a distance between the wafer and a gas supply assembly according to the process stages, and exhausting the process gas.

In another exemplary embodiment of the present invention, the distance between the wafer and the gas supply assembly is increased as the process time elapses.

In yet another exemplary embodiment of the present invention, the distance between the wafer and the gas supply assembly is adjusted to three positions including an initial position, an intermediate position, and an end position.

In still another exemplary embodiment of the present invention, the process gas is supplied to only a center section of the wafer in the initial position, and to the center section and edge portions of the wafer in the intermediate and end positions.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Exemplary embodiments of the present invention will now be described in detail with reference to the accompanying drawings.

Figure 1:
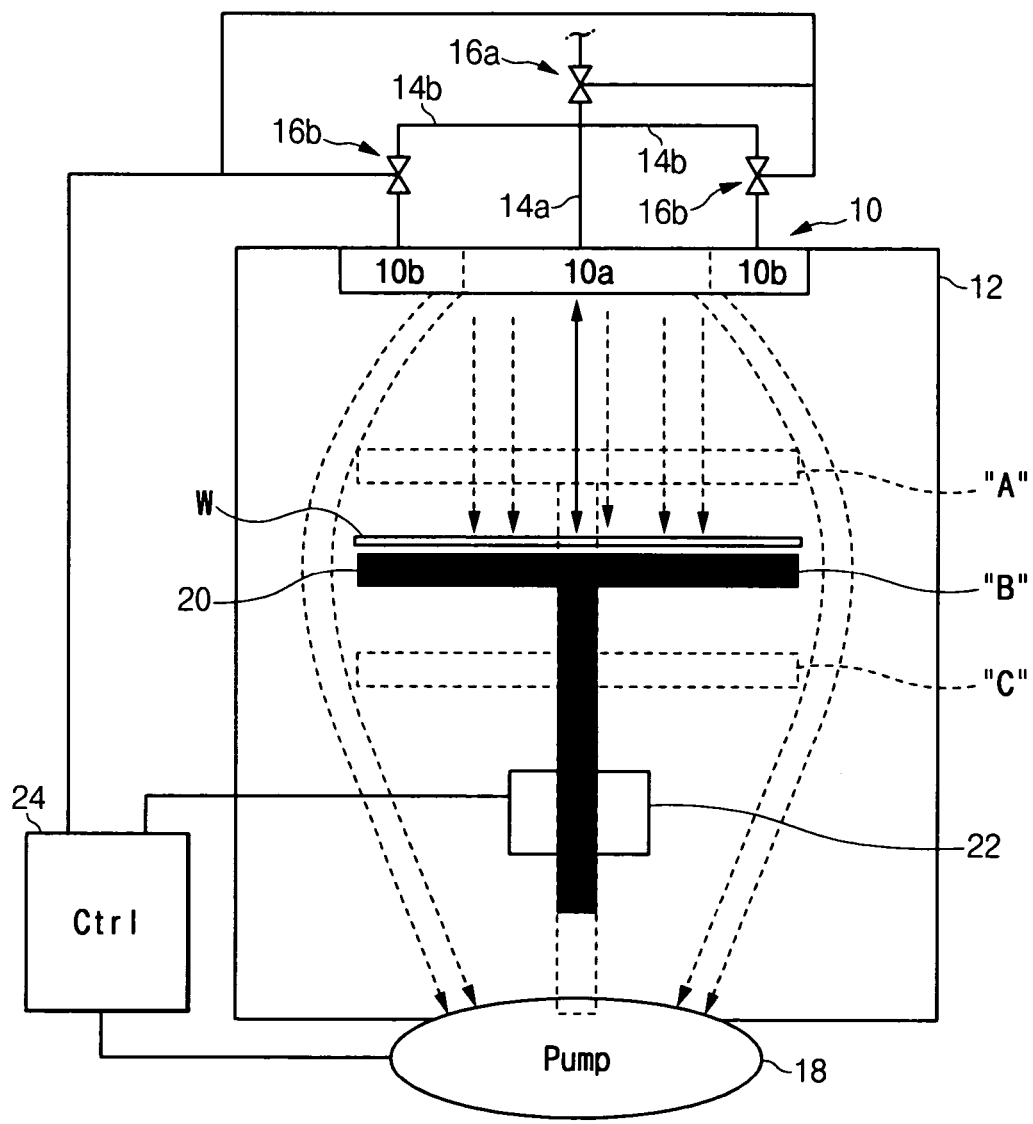
FIG. 1 is a side view of a chemical vapor deposition apparatus according to an exemplary embodiment of the present invention.

With reference to FIG. 1, a chemical vapor deposition (CVD) apparatus according to an exemplary embodiment of the present invention includes a shower head 10, mounted on an upper area of a process chamber 12 and configured to inject a process gas inside the chamber 12. The shower head 10 is divided into two sections. A first section 10a occupies a center portion of the shower head 10, and second section 10b occupies an outer portion of the shower head 10. A process gas line 14a is connected to the first section 10a, and a process gas line 14b is connected to the second section 10b. Also, a control valve 16a is mounted on the process gas line 14a, and a control valve 16b is mounted on each of the process gas lines 14b.

A vacuum pump 18 is mounted on a lower area of the process chamber 12. The vacuum pump 18 controls the exhaust of the process gas. Further, a chuck 20 on which a wafer W is placed is mounted in the process chamber 12. The chuck 20 is raised and lowered by a position control assembly 22 including, for example, a cylinder and a motor. The position control assembly 22 is driven by control signals of a controller 24. The control valves 16a and 16b are opened and closed also by signal outputs of controller 24.

Figure 2:
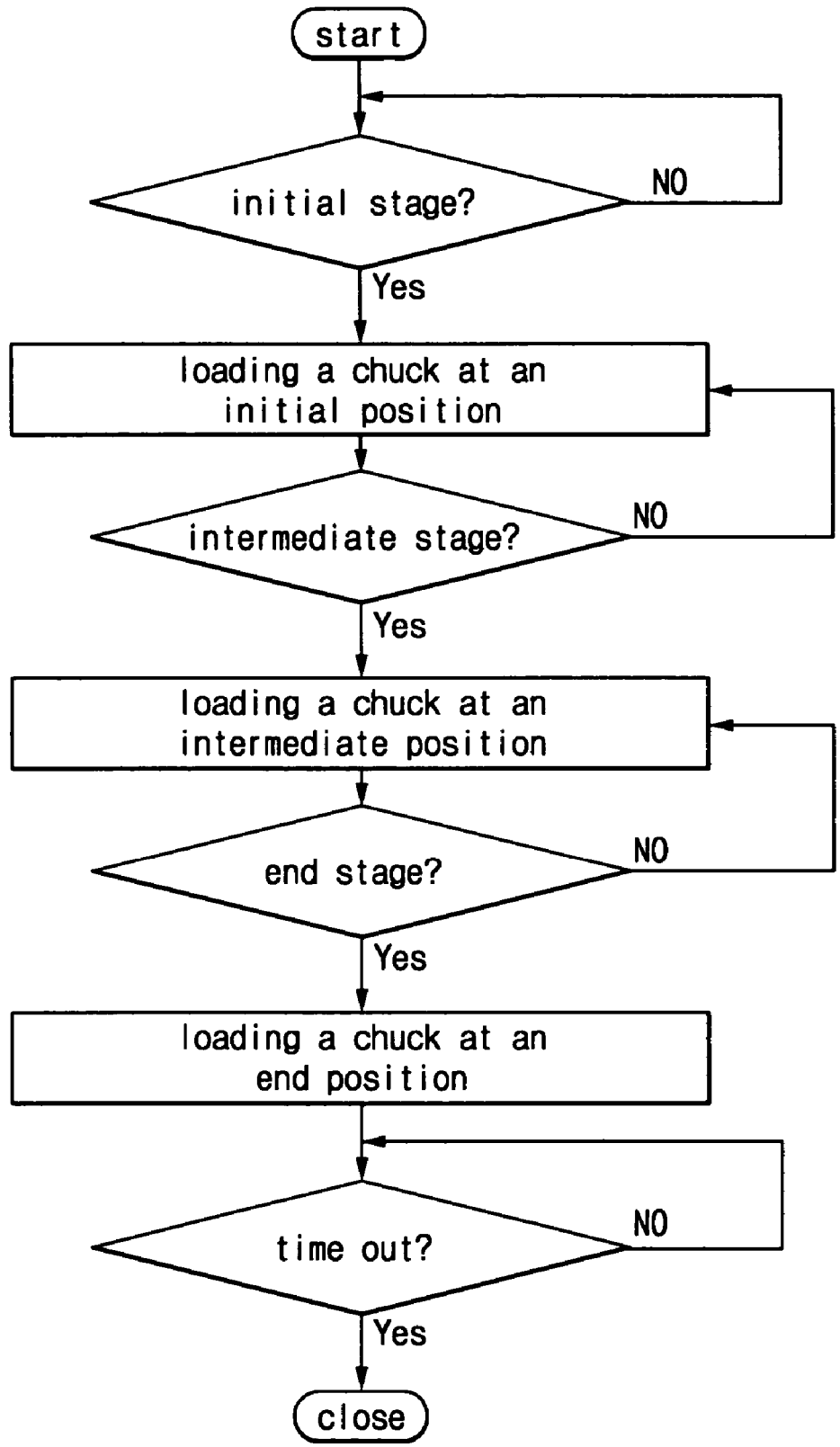
FIG. 2 is a flow chart of a chemical vapor deposition method according to an exemplary embodiment of the present invention.

A CVD method using the CVD apparatus according to an exemplary embodiment of the present invention will be described with reference to FIG. 2. In the CVD method of the present invention, the support 20 is raised and lowered during the deposition process. More particularly, the process time is divided into different process stages (e.g., initial, intermediate, and end stages) and the distance between the wafer and the gas supply is varied according to the process stage. In this embodiment, the process stages depend on the type of process gas used. This raising and lowering of the chuck 20 varies the distance between the shower head 10 and the wafer W.

In more detail, the support 20 is adjusted to three different positions A, B, and C, inside the process chamber 12. In this embodiment, the three different positions depend on the process stage. In the initial stage, a process gas is supplied to the inside of the process chamber to perform deposition and the chuck 20 is raised to position A. This results in doing deposition at the smallest distance between the shower head 10 and the wafer W. In the intermediate stage, a process gas is still supplied to the inside of the process chamber to perform deposition while the chuck 20 is adjusted to position B, which is below position A. In the end stage, deposition is performed in a state where the chuck 20 is located at position C, which is below position B.

By varying the spacing between the shower head 10 and the wafer W, depending on the stage of the deposition process, the deposition layer does not become thicker at edges of the wafer W than at a center portion thereof.

Figure 3:
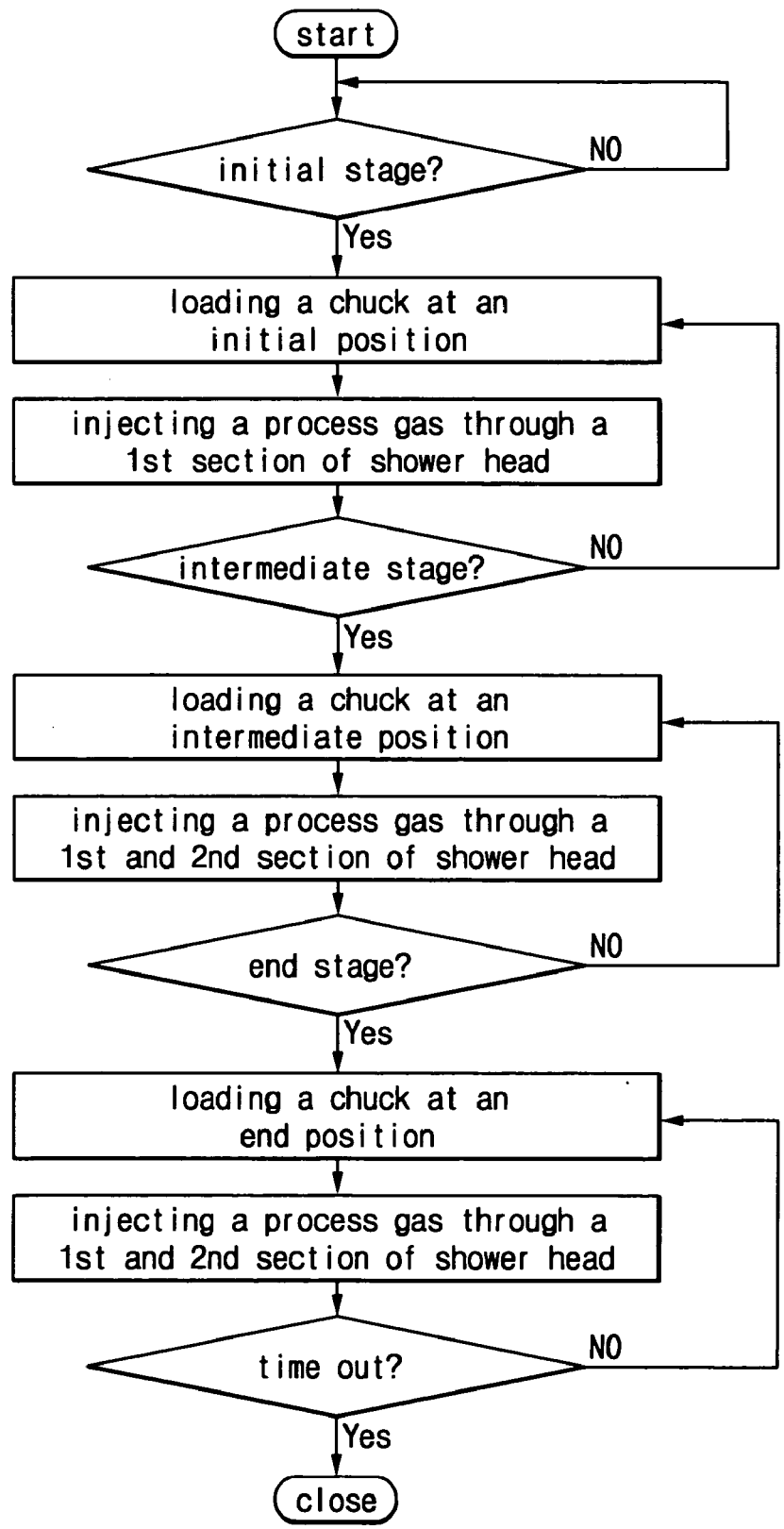
FIG. 3 is a flow chart of a chemical vapor deposition method according to another exemplary embodiment of the present invention.

Preferably, with reference to FIG. 3, process gas is injected into the process chamber 12 only through the first section 10a in the initial stage, whereas it is injected into the process chamber 12 through the first section 10a and the second section 10b in the intermediate and end stages.

By selectively supplying the process gas onto the edges of the wafer W while adjusting the distance between the shower head 10 and the wafer W, an even more uniform thickness of the deposition layer may be realized.

As described above, there are provided three different positions A, B, and C of the chuck 20 corresponding to three different process stages. However, in another embodiment of the invention, it is possible to divide the process time into a greater number of process stages and to create a greater number of positions where the support 20 is adjusted.

For example, in the case where the process chamber 12 has an effective height (i.e., a distance between the two extreme positions of the chuck 20) of 100 cm and deposition is performed for 100 seconds, that is, the process time is 100 seconds, the effective height and process time may each have 100 divisions. In this case, 10% of the effective height and process time may be designated as the initial stage. During this initial stage time, the chuck 20 is lowered from 100 cm to 90 cm in 1 cm intervals and the center portion of the wafer W is supplied with process gas from the first section 10a of the shower head 10. This pattern may be continued for the remainder of the effective height and the process time while the process gas is supplied onto the wafer W through both first and second sections 10a and 10b.

In the chemical vapor deposition apparatus and method of the present invention described above, while forming a deposition layer on the surface of a wafer, the spacing between the wafer and the shower head of the apparatus is increased in stages, or in a continuous manner where there is a direct relationship between the process time and the chuck position. Also, the process gas may be selectively supplied to different areas of the wafer depending on the position of the wafer relative to the shower head. As a result, the problem of uneven thickness in the deposition layer, between the center and edges of the wafer, is avoided.

Although embodiments of the present invention have been described in detail hereinabove in connection with certain exemplary embodiments, it should be understood that the invention is not limited to the exemplary embodiments disclosed in the foregoing description. On the contrary, the invention is intended to cover various modifications and/or equivalent arrangements without departing from the spirit and scope of the present invention, as defined in the appended claims.

What is claimed is:

1. A chemical vapor deposition apparatus, comprising:

a process chamber, inside of which a wafer is secured to perform a deposition process thereon;

a gas supply assembly mounted in the process chamber and configured to supply a process gas inside the process chamber, wherein the gas supply assembly is divided into a first section that occupies a center portion of the gas supply assembly, and a second section that occupies an outer portion of the gas supply assembly, a process gas line is connected to each of the first section and the second section, and a control valve, opened and closed by the controller, is mounted on the process gas line of the second section;

a vacuum pump mounted in the process chamber and configured to exhaust the process gas from the process chamber;

a chuck mounted in the process chamber and configured to support the wafer; a position control assembly configured to raise and lower the chuck; and a controller constructed and arranged to control the position control assembly such that a distance between the wafer and the gas supply assembly is varied from an initial position, to an intermediate position, and to an end position during the deposition process, wherein the controller controls the position control assembly such that the distance between the wafer and the gas supply assembly is successively increased from the initial position, to the intermediate position, and to the end position, and wherein the controller controls the control valve to direct the supply of the process gas from the first section of the gas supply assembly while at the initial position, and to the first and second section of the gas supply assembly while at the intermediate and end position.

2. The apparatus of claim 1, wherein the gas supply assembly is mounted at a first end of the process chamber and the vacuum pump is mounted at a second end of the process chamber, said first end being substantially opposite to said second end.

3. The apparatus of claim 1, wherein the distance between the wafer and the gas supply assembly is increased in stages or in a continuous manner.

4. The apparatus of claim 1, wherein the control valve is closed in an initial process time and is opened after the initial process time.

* * * * *